US011698603B2

(12) United States Patent
Nojima et al.

(10) Patent No.: US 11,698,603 B2
(45) Date of Patent: Jul. 11, 2023

(54) IMAGE FORMING APPARATUS INCLUDING FILTER FOR REMOVING PARTICULATES

(71) Applicant: CANON KABUSHIKI KAISHA, Tokyo (JP)

(72) Inventors: Koji Nojima, Chiba (JP); Kota Aoki, Ibaraki (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 17/686,160

(22) Filed: Mar. 3, 2022

(65) Prior Publication Data

US 2022/0291629 A1  Sep. 15, 2022

(30) Foreign Application Priority Data

Mar. 15, 2021  (JP) ................. 2021-040972
Jan. 26, 2022  (JP) ................. 2022-009818

(51) Int. Cl.
*G03G 21/00* (2006.01)
*G03G 21/20* (2006.01)
(Continued)

(52) U.S. Cl.
CPC ....... *G03G 21/206* (2013.01); *H05K 7/20181* (2013.01); *G03G 2221/1645* (2013.01); *G06K 15/12* (2013.01)

(58) Field of Classification Search
CPC ........... G03G 21/206; G03G 2221/1645; B41J 29/377; H02B 1/56; H02B 1/565; H05K 7/20181
(Continued)

(56) References Cited

U.S. PATENT DOCUMENTS 5,021,831 A     6/1991  Omoto
5,047,798 A  *  9/1991  Yamamoto ............ G03F 7/0032
                                                                355/405
(Continued)

FOREIGN PATENT DOCUMENTS

EP      3399372 A1     11/2018
JP      09196399 A  *   7/1997
(Continued)

OTHER PUBLICATIONS

Extended European Search Report dated Aug. 2, 2022, in European Patent Application No. 22155127.8.
(Continued)

*Primary Examiner* — Robert B Beatty
(74) *Attorney, Agent, or Firm* — Venable LLP (57) ABSTRACT

An image forming apparatus includes an image forming unit, a fixing unit, a heating portion and a removal unit to remove a particulate dust generated due to vaporization of a parting agent by heat in the fixing unit. The removal unit includes a sheet-like filter provided with a base layer and a collecting layer laminated on the base layer for collecting dust. The removal unit includes a holding unit to hold the filter in a cylindrical shape with the base layer outside and the collecting layer inside. The removal unit includes a fan connected to one of opening end sides of the filter held in the cylindrical shape and generates an air flow inside of the cylindrical shape which causes air passing from outside of the filter to inside to flow toward the one of the opening end sides.

14 Claims, 10 Drawing Sheets

(51) Int. Cl.
*H05K 7/20* (2006.01)
*G06K 15/12* (2006.01)

(58) Field of Classification Search
USPC .......................................................... 399/93
See application file for complete search history.

(56) References Cited

U.S. PATENT DOCUMENTS

| | | | |
|---|---|---|---|
| 10,955,798 B2 | 3/2021 | Nojima | |
| 2004/0047645 A1* | 3/2004 | No ....................... | G03G 21/203 |
| | | | 399/93 |
| 2018/0292782 A1* | 10/2018 | Nojima .............. | G03G 15/2017 |
| 2020/0201239 A1* | 6/2020 | Kawasumi ......... | G03G 21/0052 |
| 2022/0291628 A1* | 9/2022 | Nojima ................ | G03G 21/206 |

FOREIGN PATENT DOCUMENTS

| | | |
|---|---|---|
| JP | 2002-018217 | 1/2002 |
| JP | 2017-125976 A | 7/2017 |

OTHER PUBLICATIONS

U.S. Appl. No. 17/686,149, Koji Nojima Kota Aoki, filed Mar. 3, 2022.

* cited by examiner

IMAGE FORMING APPARATUS INCLUDING FILTER FOR REMOVING PARTICULATES

FIELD OF THE INVENTION AND RELATED ART

The present invention relates to an image forming apparatus using electrophotographic technology, such as a printer, a copying machine, a FAX machine or a multifunction machine.

The image forming apparatus contains a fixing device that fixes a toner image on a recording material by applying heat and pressure to the toner image formed on the recording material. The fixing device has an endless fixing belt and a pressure roller that contacts and pressurizes the fixing belt, and the recording material is nipped and fed through a fixing nip portion formed by the fixing belt and the pressure roller while being heated and pressurized. A filter unit is then placed in the vicinity of the fixing device (Japanese Laid-Open Patent Application No. 2017-125976). The filter unit is mainly provided for the purpose of collecting fine dust particles of "several nm to several hundred nm" in size, which are caused by heat vaporization of wax contained in a toner as a parting agent. The filter unit consists of a duct having a suction opening and an exhaust opening, a fan that sucks air that passes through the duct from the suction opening to the exhaust opening, a filter that is placed in the suction opening and removes dust from the sucked air, and a filter that removes dust from the sucked air.

By the way, in the past, a filter was installed in a suction opening of a duct in a flat shape or a curved shape curved inside of the duct. However, in the case of using a filter with a base layer and a collecting layer that collects dust, if the filter is installed at the suction opening in a flat or curved shape inside of the duct, as described above, it was difficult for the dust to be removed by the filter.

The present invention has been made in order to provide an image forming apparatus that considers the above problem, in a case of using a filter consisting of a base layer and a collecting layer that collects dust provided at the suction opening of a duct, so that the filter can sufficiently remove the dust.

SUMMARY OF THE INVENTION

One embodiment of the present invention includes an image forming apparatus comprising an image forming unit configured to form a toner image on a recording material by using toner containing a parting agent; a fixing unit provided with a first rotatable member and a second rotatable member contacting said first rotatable member, configured to form a fixing nip portion for fixing the toner image on the recording material by applying heat and pressure while feeding and nipping the recording material; a heating portion configured to heat said first rotatable member; a duct in which a suction opening provided in a neighborhood of said fixing unit and an exhaust opening through which air sucked from said suction opening is discharged; a fan connected to said exhaust opening and configured to generate an air flow from said suction opening to said exhaust opening; and a sheet-like filter provided with a base layer and a collecting layer laminated on said base layer for collecting dust, and configured to cover said suction opening; wherein when a downstream side of said filter with respect to a suction direction is inside and an upstream side of said filet with respect to the suction direction is outside, said filter is disposed so that said collecting layer is inside and said base layer is outside and said filter becomes a convex shape to the outside from said suction opening, and wherein when a width of said suction opening in a widthwise direction is d1, a maximum height of said filter from an imaginary surface passing through an edge portion of said suction opening is L, said filter satisfies the following formula: $0.003 < L/d1 < 5$.

Further features of the present invention will become apparent from the following description of exemplary embodiments (with reference to the attached drawings).

BRIEF DESCRIPTION OF THE DRAWINGS

Part (a) of FIG. 2 shows a cross-sectional view showing the fixing device, and part (b) of FIG. 2 shows an exploded view showing the belt unit.

Part (a) of FIG. 3 shows a perspective view showing the filter unit and fixing device of the first embodiment, part (b) of FIG. 3 shows a perspective view of the filter unit, part (c) of FIG. 3 shows a perspective view without the filter, and part (d) of FIG. 3 shows a cross-sectional view showing the duct and filter.

DESCRIPTION OF THE EMBODIMENTS

First Embodiment

[Image Forming Apparatus]

Figure 1:
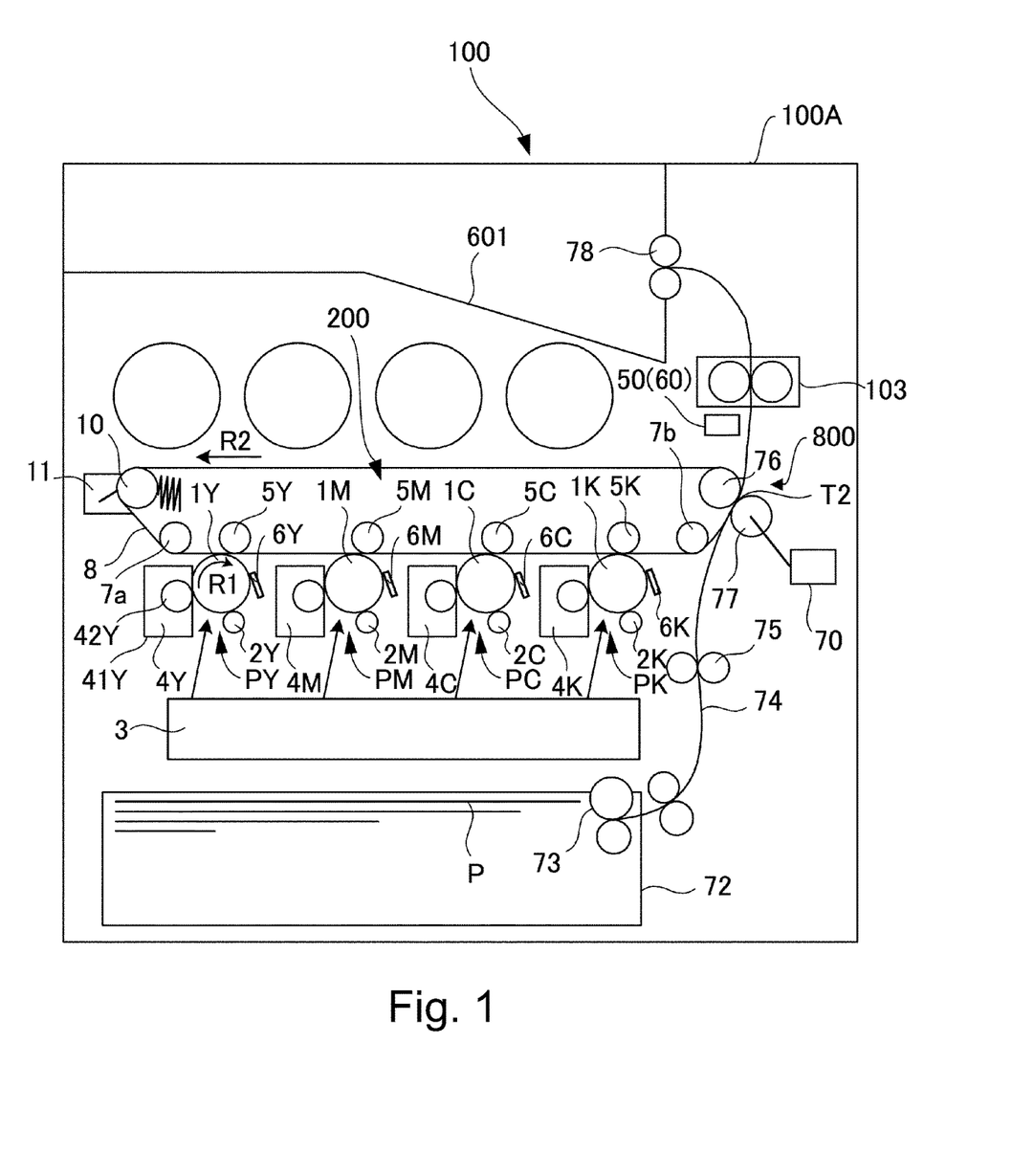
FIG. 1 is a schematic view of the configuration of an image forming apparatus for the present embodiment.

The following is an explanation of the present embodiment. First, a configuration of an image forming apparatus of the present embodiment will be explained using FIG. 1. The image forming apparatus 100 shown in FIG. 1 is a full-color printer of an intermediate transfer method equipped with a plurality of image forming portions PY, PM, PC, and PK of yellow, magenta, cyan, and black along the intermediate transfer belt 8.

The image forming apparatus 100 forms an image on a recording material P in response to image information from an external device such as a document reader connected to the main assembly of the apparatus 100A or a personal computer communicatively connected to the main assembly of the apparatus 100A (not shown). The recording material P can be various types of sheet materials such as plain paper, thick paper, rough paper, uneven paper, coated paper, etc., plastic film, cloth, etc. In the case of the present embodiment, image forming portions PY to PK, primary transfer rollers 5Y to 5K, the intermediate transfer belt 8, a secondary transfer inner roller 76, a secondary transfer outer roller 77, and the like constitute an image forming unit 200 that forms a toner image on the recording material P.

For example, a recording material P is stacked in a cassette 72 and fed by a feeding roller 73 to a feeding path 74 one by one according to the image formation timing. Alternatively, the recording material P stacked on a manual feed tray (not shown) is fed one sheet at a time to the feeding path 74. The recording material P is fed to a registration roller 75 located in the middle of the feeding path 74, and after skew correction and timing correction of the recording material P are performed by the registration roller 75, it is fed to the secondary transfer nip portion T2. The secondary transfer nip portion T2 is a transferring nip formed by the secondary transfer inner roller 76 and secondary transfer outer roller 77 opposing each other. In the secondary transfer nip portion T2, a secondary transfer voltage is applied to the secondary transfer outer roller 77 by the power supply 70, and a current is generated between the secondary transfer outer roller 77 and the secondary transfer inner roller 76, causing the toner image to be transferred from the intermediate transfer belt 8 to the recording material P. In other words, in the present embodiment, the secondary transfer inner roller 76 and the secondary transfer outer roller 77 constitute the transfer portion 800 that transfers the toner image from the intermediate transfer belt 8 to the recording material P.

For the feeding process of the recording material P up to the secondary transfer nip portion T2 described above, the image forming process of the image sent up to the secondary transfer nip portion T2 at the same timing is explained. First, image forming portions PY, PM, PC, and PK are explained. However, the image forming portions PY, PM, PC, and PK are configured almost identically, except that the toner colors used in the developing devices 4Y, 4M, 4C, and 4K are different: yellow, magenta, cyan, and black. Therefore, in the following explanation, the yellow image forming portion PY will be used as an example, and the explanation of the other image forming portions PM, PC, and PK will be omitted. For convenience of drawings, only the image forming portion PY is marked for the developing container 41Y and the developing roller 42Y described below.

The image forming portion PY mainly consists of a photosensitive drum 1Y, a charging device 2Y, a developing device 4Y, and a photosensitive drum cleaner 6Y. The surface of the photosensitive drum 1Y, which is driven by rotation, is uniformly charged beforehand by the charging device 2Y, and then an electrostatic latent image is formed by an exposure device 3 that is driven based on the image information signal. Next, the electrostatic latent image formed on the photosensitive drum 1Y is visualized through toner development by the developing device 4Y. The developing device 4Y has a developing container 41Y that contains a developer, a developing roller 42Y (also called a developing sleeve) that rotates bearing the developer, and by applying a developing voltage to the developing roller 42Y, the electrostatic latent image is developed into a toner image. After that, a primary transfer roller 5Y, which is placed opposite the image forming portion PY and the intermediate transfer belt 8, applies a predetermined pressure and primary transfer bias, and the toner image formed on the photosensitive drum 1Y is transferred to the intermediate transfer belt 8. The toner remaining slightly on the photosensitive drum 1Y after the primary transfer is removed by the photosensitive drum cleaner 6Y.

The intermediate transfer belt 8 as an image bearing member is stretched by tension rollers 10, the secondary transfer inner roller 76, and idler rollers 7a and 7b as tension rollers, and is driven to move in the direction of arrow R2 in the figure. In the case of the present embodiment, the secondary transfer inner roller 76 also serves as the driving roller that drives the intermediate transfer belt 8. The image forming process for each color processed by image forming portions PY to PK described above is performed at a timing that sequentially overlaps the toner image of the color upstream in the moving direction that has been primary transferred onto the intermediate transfer belt 8. As a result, a full-color toner image is finally carried on the intermediate transfer belt 8 and is fed to the secondary transfer nip portion T2. The remaining toner after passing through the secondary transfer nip portion T2 is removed from the intermediate transfer belt by a transfer cleaner device 11.

With the feeding process and the image formation process described above, the timing of the recording material P and the full-color toner image matches in the secondary transfer nip portion T2, and the toner image is transferred from the intermediate transfer belt 8 to the recording material P. After that, the recording material P is fed to a fixing device 103, where the toner image is melted and fixed on the recording material P by the fixing device 103 applying heat and pressure. After the toner image has been fixed, the recording material P is discharged onto the paper discharge tray 601 by a discharge roller 78.

[Fixing Device]

Next, the fixing device 103 will be explained using parts (a) and (b) of FIG. 2. In the present embodiment, a fixing device 103 with a low heat capacity is shown as an example, which can fix a toner image to a recording material P using an endless fixing belt 105 formed into a cylinder. In part (a) of FIG. 2, flanges 106L and 106R described below are omitted for the sake of the drawings.

Figure 2:
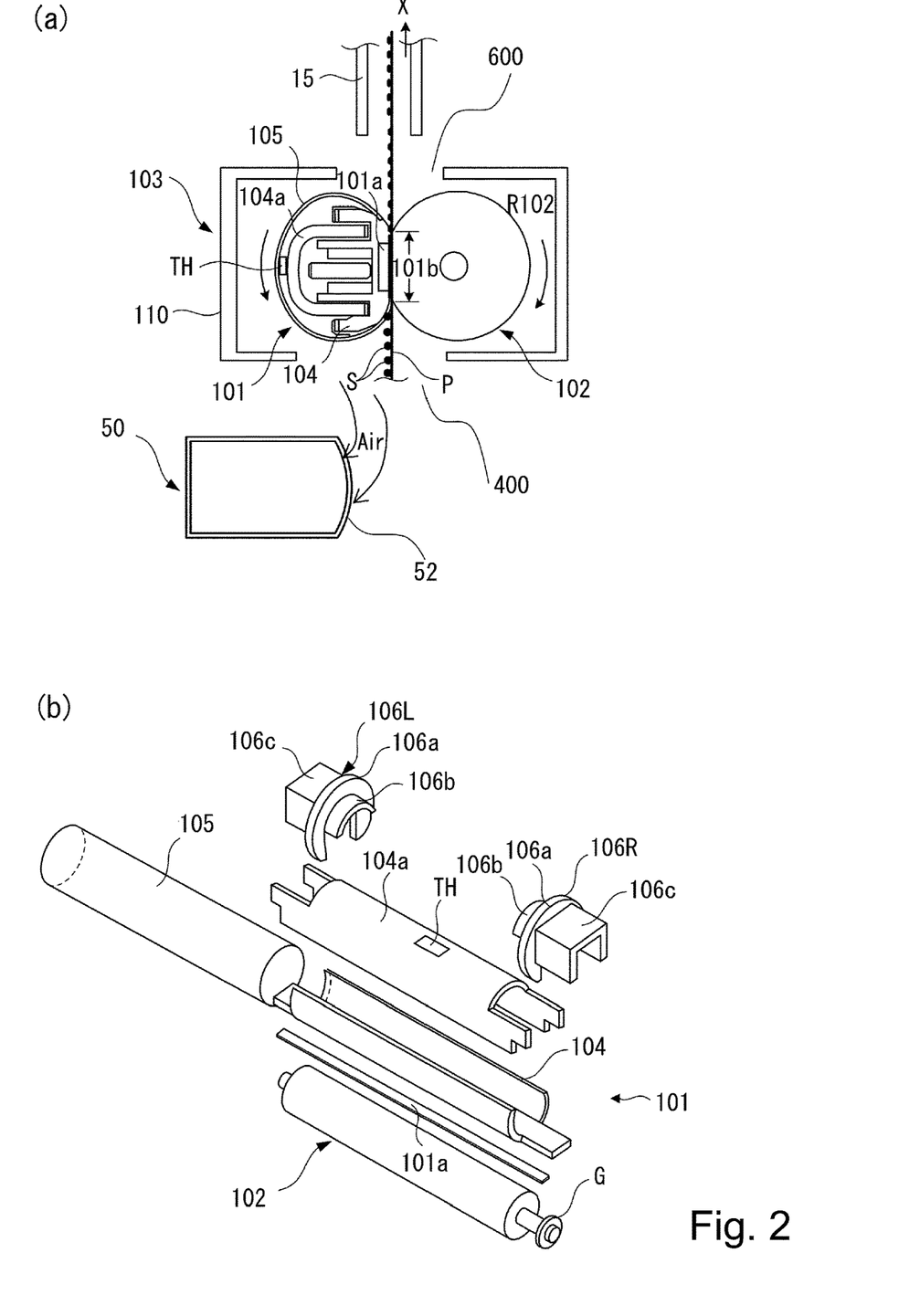

As shown in part (a) of FIG. 2, a fixing device 103 is roughly divided into a belt unit 101, a pressure roller 102, and a casing 110. The belt unit 101 and the pressure roller 102 are housed in the casing 110, and the casing 110 has an open sheet entrance 400 and an open sheet exit 600 to allow the recording material P to pass through the casing 110, and at that time, the recording material P is nipped and fed by a fixing nip portion 101b formed between the fixing belt 105 and the pressure roller 102 as described below.

In the case of the present embodiment, the fixing device 103 is positioned so that the sheet entrance 400 is lower in the gravity direction than the sheet exit 600, so that a recording material P is fed from lower to upper in the gravity direction (so-called vertical path feeding). In addition, a feeding guide 15 is installed downstream of the sheet exit 600 to guide the feeding of the recording material P that has passed through a fixing nip portion 101b.

The belt unit 101 contacts the pressure roller 102 to form a fixing nip portion 101b between a fixing belt 105 and the pressure roller 102, and fixes the toner image to the recording material P in the fixing nip portion 101b. As shown in part (b) of FIG. 2, the belt unit 101 has the endless fixing belt 105, a heater 101a, a heater holder 104 that holds the heater 101a, and a pressure stay 104a that supports the heater holder 104. In addition, the belt unit 101 has flanges 106L and 106R that hold one end side and the other end side of the fixing belt 105, respectively, in the widthwise direction intersecting the feeding direction of the recording material P.

The fixing belt 105 as a first rotatable member is a belt member that contacts the recording material P passing through the fixing nip portion 101b (see part (a) of FIG. 2) and applies heat to the recording material P. The fixing belt 105 is formed in a cylindrical shape (endless shape) and has overall flexibility. The heater 101a, the heater holder 104, and the pressure stay 104a are arranged non-rotationally on the inner circumference of the rotating fixing belt 105.

The heater 101a as a heating portion contacts the inner surface of the fixing belt 105 and heats the fixing belt 105. In the present embodiment, a plate-shaped ceramic heater that generates heat when energized is used as the heater 101a. The heater holder 104 is shaped as a semicircular arc in the cross-sectional area and holds the heater 101a so that it contacts the inner surface of the rotating fixing belt 105 and slides on the inner surface of the rotating fixing belt 105 to regulate the runout of the fixing belt 105 in the radial direction.

The pressure stay 104a is a member to press the heater 101a and the heater holder 104 uniformly against the fixing belt 105 in the widthwise direction. The pressure stay 104a is equipped with a thermistor TH that can detect the temperature of the fixing belt 105. The thermistor TH detects the temperature of the fixing belt 105.

Flanges 106L and 106R are a pair of members that rotatably hold end portions in the widthwise direction of the fixing belt 105 and non-rotatably hold the heater holder 104 and the pressure stay 104a. The flanges 106L and 106R have a flange portion 106A, a backup portion 106B, and a pressurized portion 106C, respectively, as shown in part (b) of FIG. 2.

The flange portion 106a is formed with a diameter larger than the diameter of the fixing belt 105, and receives the edge of the rotating fixing belt 105 to regulate the movement of the fixing belt 105 in the widthwise direction. The backup portion 106b holds the rotating fixing belt 105 from the inner surface side to maintain the fixing belt 105 in a cylindrical shape. A pressurized portion 106c is provided to receive the pressing pressure by a pressurizing spring (not shown) in order to move the flanges 106L and 106R toward the pressure roller 102. When the pressurized portion 106c receives the pressing pressure by the pressurizing spring, the flanges 106L and 106R press the fixing belt 105 against the pressurizing roller 102 through the pressurizing stay 104a and the heater holder 104. In this way, the fixing nip portion 101b is formed.

The pressure roller 102 as a second rotatable member has a metal (e.g., aluminum or iron) core, an elastic layer such as silicon rubber, and a release layer covering the elastic layer. The core is held in place by a bearing G. As described above, the pressure roller 102 is pressed against the fixing belt 105 to form the fixing nip portion 101b. When the pressure roller 102 is rotated in the rotational direction (arrow R102 in part (a) of FIG. 2) by a motor, drive gear, or the like (not shown), the rotational force of the pressure roller 102 is transmitted to the fixing belt 105 by the frictional force generated in the fixing nip portion 101b. Thus, the endless fixing belt 105 rotates following the pressure roller 102 (so-called pressure roller drive system).

As described above, a recording material S on which a toner image is formed is nipped and fed while heat and pressure are applied to the fixing nip portion 101b formed by the rotating pressure roller 102 and the fixing belt 105. The toner contains a wax made of paraffin, for example, as a parting agent to make it easier to separate the recording material P with the toner image fixed from the fixing belt 105. The wax is dissolved by heat, and the dissolved wax seeps into the surface of the toner image, making it easier for the recording material P to be separated from the fixing belt 105.

However, some of the wax that seeped out onto the surface of the toner image sometimes adhered to the fixing belt 105. In such a case, the wax adhered to the fixing belt 105 will vaporize (gasify) when the surface temperature of the fixing belt 105 rises above a predetermined temperature. Then, the vaporized wax solidifies as it is cooled by the air inside the main assembly of the apparatus 100A, and becomes fine dust particles (UFP: Ultra-Fine Particles) with a particle diameter of several nm to several hundred nm, which can float inside the main assembly of the apparatus 100A.

This phenomenon of fine dust particles is called nucleation, which occurs when the wax vaporized by heat is exposed to a lower temperature environment and is supercooled. The fine dust particles generated by vaporization of the wax are sticky and tend to adhere to various places in the main assembly of the apparatus 100A. For example, if the above dust adheres to the feeding guide 15 or the discharge roller 78 (see FIG. 1), it is undesirable because the dust is transferred to a recording material P and contaminates the recording material P.

In view of the above, a filter unit 50 is installed upstream of the fixing device 103 in the feeding direction (arrow X direction) of the recording material P, as shown in part (a) of FIG. 2. The filter unit 50 vacuums the above dust (UFP) generated by the fixing device 103 together with the air near the fixing device 103, removes the dust from the vacuumed air, and discharges the air from which the dust has been removed. The filter unit 50 will be described below (see parts (a) through (d) of FIG. 3).

In the present embodiment, the term "wax" is used to include not only pure waxes but also compounds containing the molecular structure of waxes. For example, a compound in a wax molecular structure such as a hydrocarbon chain reacts with the resin molecules of the toner. As a parting agent, not only such waxes but also silicon oil, for example, can be used as long as it has a mold-releasing effect. However, even if silicon oil is used, it may vaporize due to the heat used to fix the toner image in the fixing device 103, resulting in generation of fine dust particles as described above.

<Filter Unit>

Next, a filter unit 50 of the present embodiment will be explained using parts (a) through (d) of FIG. 3 with reference to FIGS. 1 and 2. In the description of the first embodiment, the downstream side of the suction direction (arrow Z direction) is referred to as the inner side, and the upstream side of the suction direction is referred to as the outer side.

The filter unit 50 of the present embodiment is roughly divided into a duct 51, a filter 52, and a fan 53. The filter unit 50 is located near a fixing device 103, and the duct 51 is located between a transfer portion 800 and the fixing device 103 in the feeding direction (arrow X direction) of recording material P (see FIG. 1), and the filter 52 arranged in the suction opening 51a faces the feeding path of the recording material P. In addition, the duct 51 is arranged in the main assembly of the apparatus 100A so that the filter 52 is located on the fixing belt 105 side (first rotatable member side) from the fixing nip portion 101b. This is because the fixing belt 105 side, which is relatively hotter than the pressure roller 102 due to heating by the heater 101a (see FIG. 2), tends to generate the dust (UFP) described above, and the filter unit 50 can effectively remove the generated dust.

In the case of the present embodiment, the duct 51 is extended along the direction of the rotation axis of the fixing belt 105 and connected to the fan 53 at the longitudinal end. As shown in part (c) of FIG. 3, a suction opening 51a for air intake is formed in the duct 51 along the direction of the axis of rotation of the fixing belt 105. In addition, the duct 51 has an exhaust opening 51c for exhausting the air sucked in from the suction opening 51a from inside the duct 51.

A sheet-like filter 52 is installed in the suction opening 51a of the duct 51. The filter 52 is thermoplastic and is attached to cover the suction opening 51a without gaps, for example, by thermal bonding. In the present embodiment, as shown in part (d) of FIG. 3, the filter 52 is installed in the suction opening 51a so that it has a convex shape protruding outward from the suction opening 51a. As shown in part (b) of FIG. 3, the duct 51 is provided with a support rib 51b as a supporting member that supports the filter 52 placed in the suction opening 51a from the inside and maintains it in a convex shape. The shape of the filter 52 in the state where it is arranged in the suction opening 51a will be explained later.

The fan 53 used in the present embodiment is a suction fan and is connected to the duct 51 so that it can suction air that is exhausted from the exhaust opening 51c through the duct 51. When the fan 53 operates and starts to suction air, an air flow is generated from the suction opening 51a through the duct 51 to the exhaust opening 51c. The fan 53 starts operating in conjunction with the start of an image formation job and stops operating with the end of the image formation job. While the fan 53 is operating, air containing dust (UFP) generated by the fixing device 103 flows from the fixing device 103 toward the duct 51 and is drawn into the duct 51 through the filter 52, as shown in part (a) of FIG. 3. When air containing dust (UFP) passes through the filter 52 (collecting layer to be described in detail later), the dust in the air is removed by the filter 52. The air that has passed through the filter 52 is discharged from the exhaust opening 51c through the duct 51. The air discharged from the exhaust opening 51c is sent by the fan 53 to the exhaust duct (not shown) provided in the main assembly of the apparatus 100A, and is discharged outside the apparatus.

<Filter>

Figure 4:
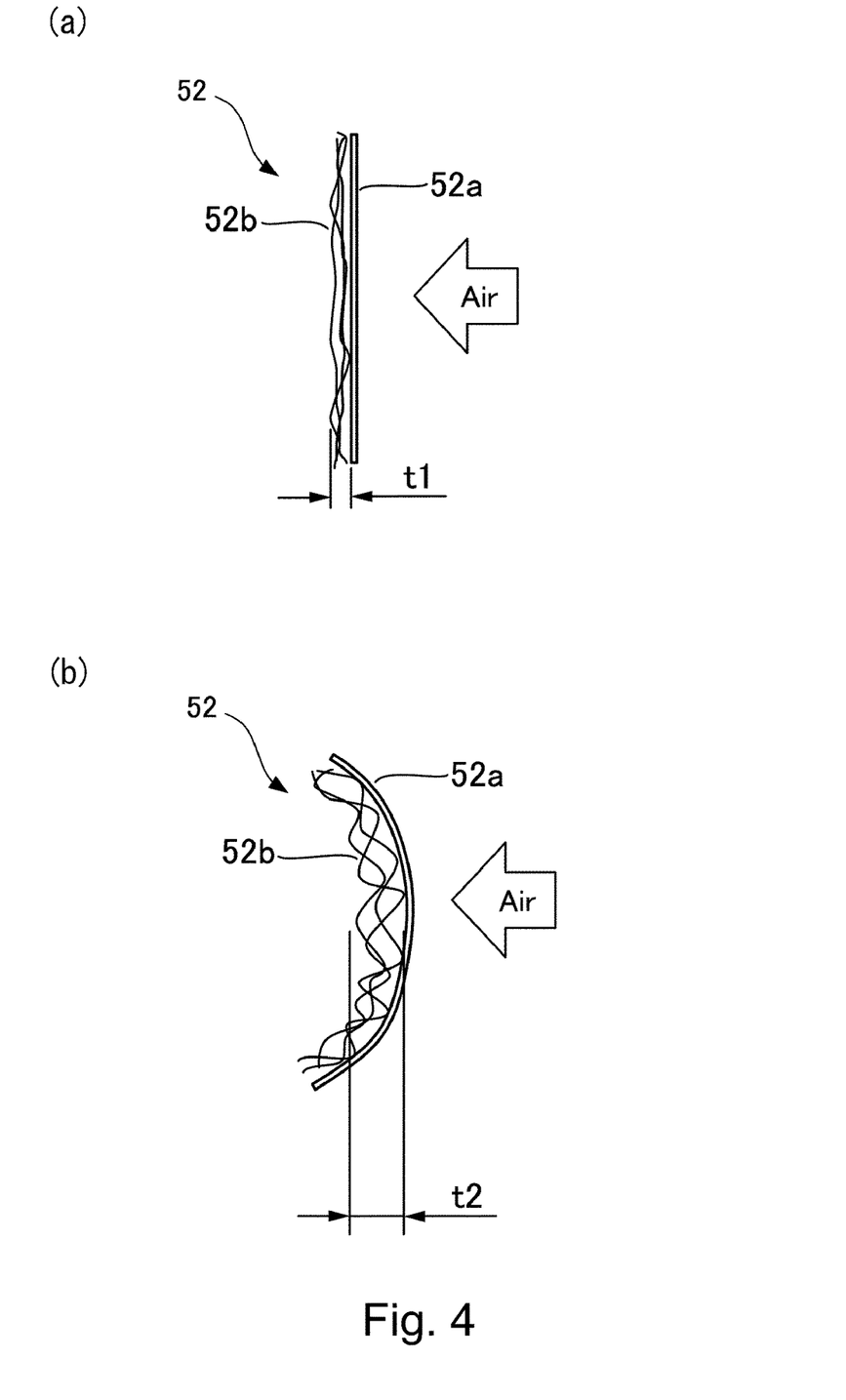
FIG. 4 is a cross-sectional view showing the shape of the filter, part (a) of FIG. 4 showing the filter not installed in the duct, and part (b) of FIG. 4 showing the filter installed in the duct.

The sheet-like filter 52 used in the present embodiment is described using parts (a) and (b) of FIG. 4. Part (a) of FIG. 4 shows the cross-sectional shape (flat) of the filter 52 when it is not installed in the duct 51, and part (b) of FIG. 4 shows the cross-sectional shape (curved) of the filter 52 when it is installed in the duct 51.

As shown in part (a) of FIG. 4, the filter 52 is formed in the form of a sheet with a collecting layer 52b, which collects dust, laminated on a reinforcing layer 52a as the base layer. In the present embodiment, the reinforcing layer 52a is used to provide a certain rigidity to the filter 52. For example, a polypropylene fiber nonwoven fabric is used as the collecting layer 52b, and a polyethylene terephthalate fiber (PET fiber) nonwoven fabric, for example, which is more rigid than the collecting layer 52b, is used as the reinforcing layer 52a.

Polypropylene fiber nonwoven fabrics are made of micro-sized polypropylene fibers that are densely intertwined and electrostatically bonded. Polypropylene fiber nonwoven fabric is highly effective in collecting dust due to the physical blocking effect of the polypropylene fibers and the electrostatic adsorption effect of the electrostatic force. However, due to the low rigidity of polypropylene fiber nonwoven fabric, if it is used as it is as a filter 52, it will deform when air is passed through it, making it difficult to collect dust. Therefore, to suppress such deformation, the collecting layer 52b of polypropylene fiber nonwoven fabric is reinforced by the reinforcing layer 52a of PET fiber nonwoven fabric. The PET fiber nonwoven fabric is a nonwoven fabric made of PET fibers, which are thicker than polypropylene fibers, intertwined at a low density, and is suitable for providing high rigidity while reducing the airflow resistance as a filter.

One example of such a filter 52 is "FM-9106, FM-9206, FM-9306, FM-9406, FM-9806" of Japan Vilene Company, LTD., for example. The higher the numerical value of the model number, the higher the areal density of the polypropylene fiber. In the case of the present embodiment, the areal density is in the range of "50 (g/m$^2$) to 300 (g/m$^2$)". The higher the areal density, the higher the dust removal performance and pressure drop. The surface density can be selected as appropriate depending on the suction air volume and dust removal performance required for the filter unit 50 and the specifications of the fan 53. In the present embodiment, a material having a surface density equivalent to the above "FM-9806" was used for the filter 52.

The inventors conducted an experiment to investigate the dust removal rate of the filter 52 according to the difference in shape. In the experiment, FM-9806 of Japan Vilene Company, LTD. was used as the filter 52, and air containing dust was passed through the flat filter 52 shown in part (a) of FIG. 4 and the curved filter 52 (radius of curvature "15 mm") shown in part (b) of FIG. 4 at an air velocity of "0.15 m/s".

As a result of the experiment, the dust removal rate was "82%" for the flat filter 52 shown in part (a) of FIG. 4. On the other hand, in the case of the curved filter 52 shown in part (b) of FIG. 4, the dust removal rate was "93%". The dust removal rate is calculated according to Formula 1 shown below.

Dust removal rate (%)=100×(dust density before passing through filter (%)−dust density after passing through filter (%))/dust density before passing through filter (%)    Formula 1

As described above, if the filter 52 is curved, the dust removal rate is improved compared to the case where the filter 52 is flat. This is because when the sheet-like filter 52 is curved, the thickness (t2) of a collecting layer 52b becomes larger (t1<t2) than when it remains flat, as shown in parts (a) and (b) of FIG. 4. The larger the thickness of the collecting layer 52b, the longer the air containing dust will be in contact with the collecting layer 52b, and the dust collection effect of the electrostatic force of the polypropylene fibers described above will be improved.

Figure 3:
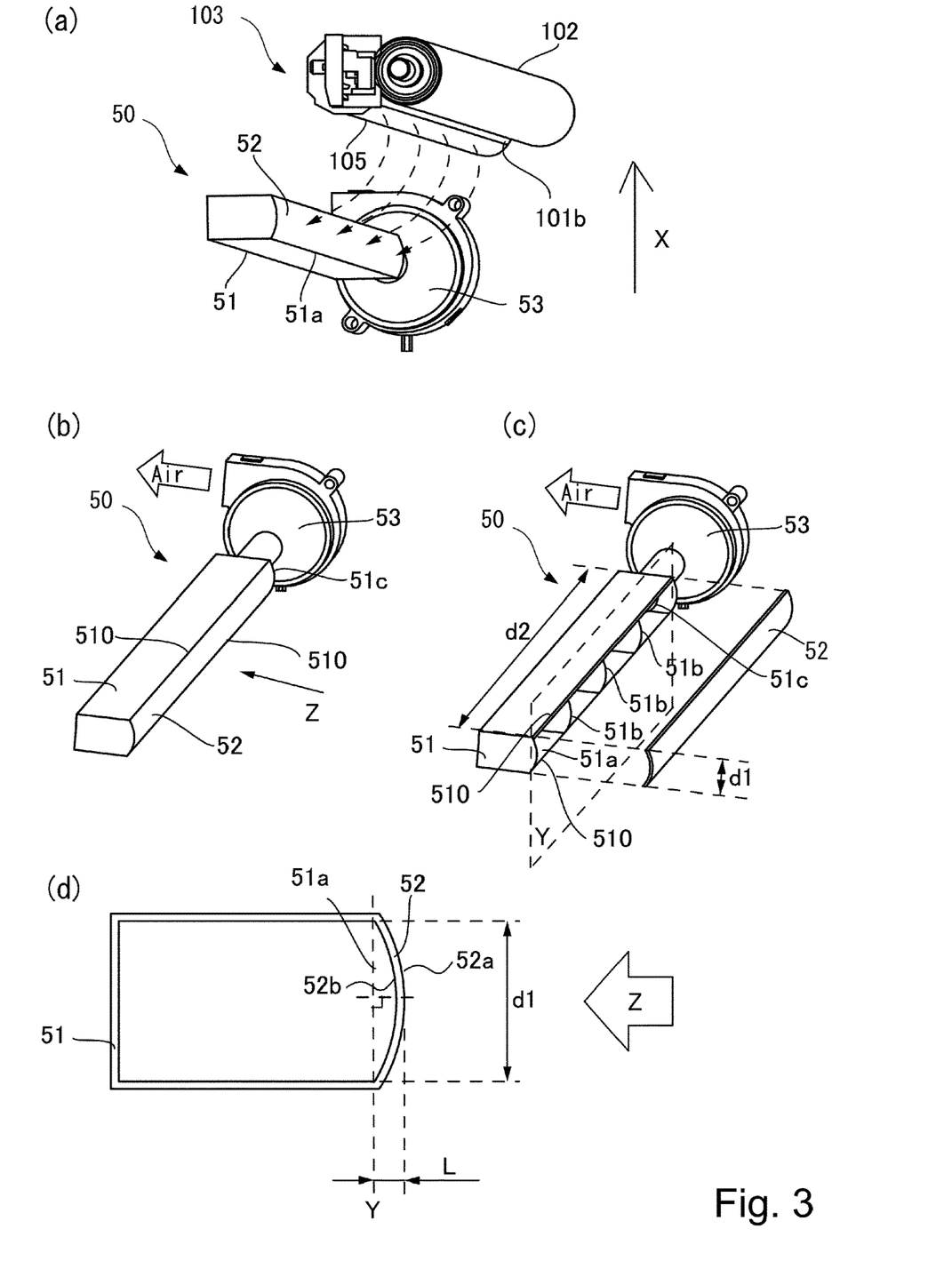

In the case of the present embodiment, in order to increase the thickness of the collecting layer 52b, the filter 52 is arranged in a convex arc shape from the suction opening 51a to the outside, with the collecting layer 52b on the inside and the reinforcing layer 52a on the outside, as shown in part (d) of FIG. 3. In other words, when the filter 52 is curved with the collecting layer 52b inside, the thickness of the reinforcing layer 52a, which has high rigidity, remains almost the same, while the thickness of the collecting layer 52b, which has lower rigidity than the reinforcing layer 52a, becomes larger than when it is flat.

However, if the filter 52 is curved too much, it becomes difficult for air to pass through the filter 52 and the dust removal rate may decrease. Therefore, in the present embodiment, the filter 52 is curved at the suction opening 51a to satisfy the Formula 2 shown below. As shown in parts (c) and (d) of FIG. 3, the width of the suction opening 51a in the short dimension is "d1", and the maximum height of the filter 52 from the virtual surface Y passing through the edge 510 of the suction opening 51a is "L".

$$0.003 < L/d1 < 5 \quad \text{Formula 2}$$

In the case of the present embodiment, the ratio of "L" for the maximum height of the filter 52 and "d1" for the width in the short dimension of the suction opening 51a is, for example, "1:5". To improve the dust removal by the filter 52, the ratio of the maximum height of the filter 52 "L" to the width "d1" in the short dimension of the suction opening 51a should be within the range of Formula 2 above.

The lower limit of Formula 2 above, "0.003", is the minimum value required to inflate the collecting layer 52b. On the other hand, the upper limit value "5" in Formula 2 above is specified to prevent the filters 52 from contacting each other. That is, while the fan 53 is operating, the filter 52 receives negative pressure toward the inside of the duct 51. When the above ratio exceeds "5", the excess filters 52 start to contact each other due to the negative pressure. The contacting portions do not function as filters 52. To avoid this, the upper limit of the above ratio is set to "5".

As described above, in the present embodiment, the filters 52 are arranged in a convex arc shape outward from the suction opening 51a, with the collecting layer 52b inside and the reinforcing layer 52a outside. When the filter is curved with the collecting layer 52b inside, the thickness of the collecting layer 52b, which is less rigid than the reinforcing layer 52a, becomes larger than when it is flat. The larger the thickness of the collecting layer 52b, the higher the removal rate of the dust contained in the air passing through the collecting layer 52b. In this way, the filters 52, which consist of a collecting layer 52b that collects dust and a reinforcing layer 52a that reinforces the collecting layer 52b, are installed in the suction opening 51a of the duct 51, and sufficient removal of dust by the filters 52 can be achieved with a simple configuration. Also, since the reinforcing layer 52a is on the outside, the filters 52 can be prevented from being damaged during assembly and maintenance replacement.

As described above, the filters 52 are not limited to being placed in the suction opening 51a so that they are curved over both ends of the short dimension (upstream and downstream of the feeding direction of the recording material P). For example, the filters 52 may be arranged in the suction opening 51a so that they are curved over both ends in the longitudinal direction (widthwise direction) relative to the suction opening 51a.

Figure 5:
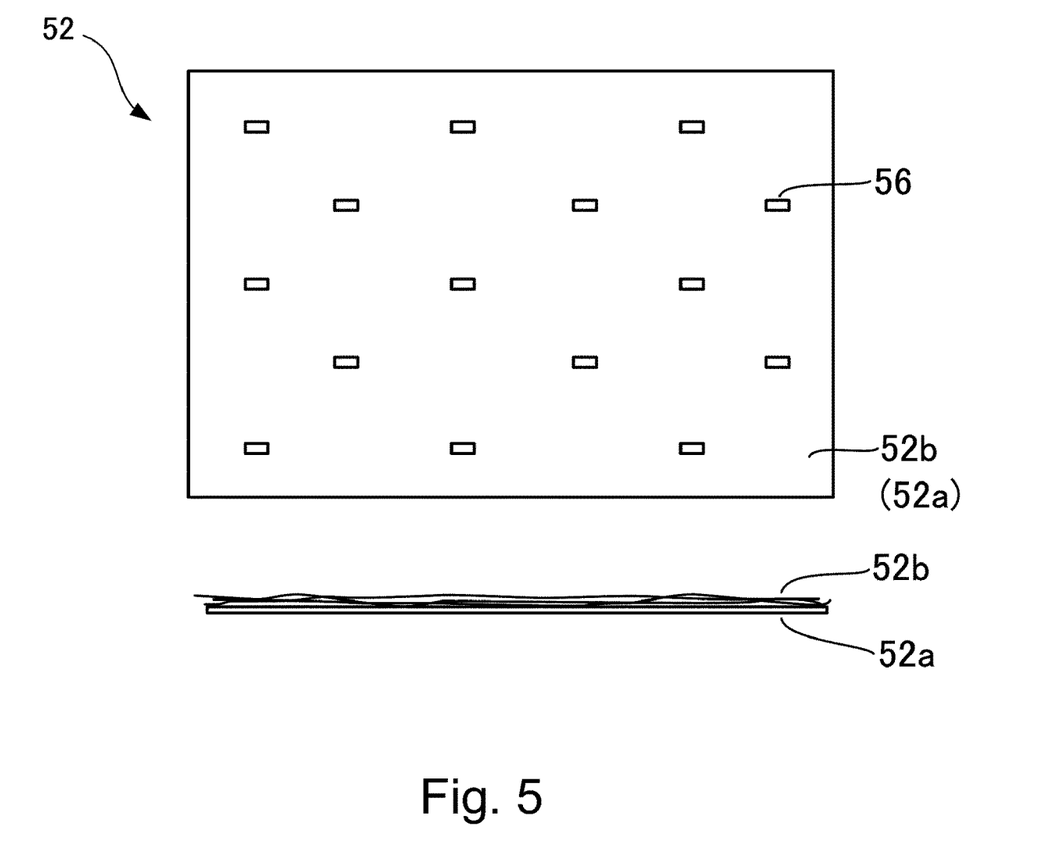
FIG. 5 is a top view showing the adhered area between the collecting layer and the reinforcing layer.

The dust removal rate of the filters 52 also depends on the adhesion between the collecting layer 52b and the reinforcing layer 52a. FIG. 5 shows the adhesion area between the collecting layer 52b and the reinforcing layer 52a. As shown in FIG. 5, the two layers of the filters 52, collecting layer 52b and reinforcing layer 52a, are adhered to each other by heat fusion at the bonding area 56. At the bonding area 56, the fibers are melted and solidified by heat fusion, so there is no air permeability. The non-permeable adhered portion 56 is not effective in collecting dust contained in the air. In addition, when the filters 52 are curved as described above, the thickness of the collecting layer 52b is unlikely to increase because the collecting layer 52b is constrained by the reinforcing layer 52a in the adhered portion 56. For the reasons mentioned above, it is preferable to keep the total area of the adhered area 56, that is, the adhered area between the collecting layer 52b and the reinforcing layer 52a, as small as possible. Therefore, in the present embodiment, the area of the collecting layer 52b and the adhered area between the collecting layer 52b and the reinforcing layer 52a are designed to satisfy "1/120<adhered area/collecting layer area<1/3", and the filters 52 in which the collecting layer 52b and the reinforcing layer 52a are adhered together are used.

Figure 6:
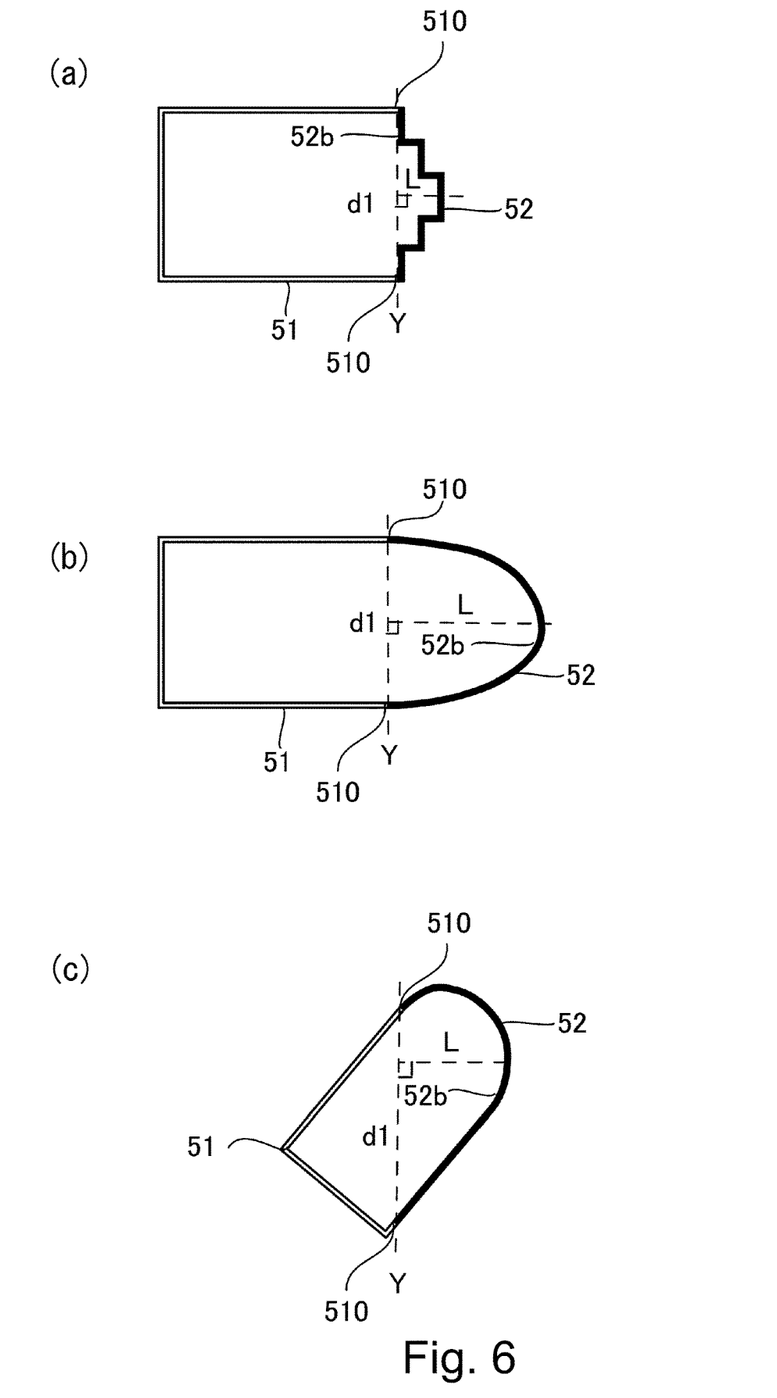
FIG. 6 is a cross-sectional drawing showing other examples of filter shapes, part (a) of FIG. 6 showing the first variant, part (b) of FIG. 6 showing the second variant, and part (c) of FIG. 6 showing the third variant.

The cross-sectional shape of the filters 52 is not limited to an arc shape as shown in part (d) of FIG. 3 when it is installed in the duct 51. FIG. 6 shows an example of a variation of the filter shape. As shown in part (a) of FIG. 6, the filters 52 may be arranged in the suction opening 51a so that the outside of the filters 52 protrudes in a staircase shape from both ends to the center in the short dimension of the suction opening 51a. Alternatively, as shown in part (b) of FIG. 6, the filters 52 may be arranged in the suction opening 51a so that they have a bell shape with a larger radius of curvature than the arc shape shown in part (d) of FIG. 3. Also, depending on the state of formation of the suction opening 51a in the duct 51, the shape may be such that the filters 52 are extended to the lower surface of the duct 51, as shown in part (c) of FIG. 6. Even in this case, it is preferable that the filters 52 arranged in the suction opening 51a face the feeding path of the recording material P.

In the above-mentioned variations, the filters 52 are arranged in the suction opening 51a in such a way that Formula 2 above is satisfied. Parts (a) through (c) of FIG. 6 show the width "d1" in the short dimension of the suction opening 51a and the maximum height "L" of the filter 52 from the virtual surface Y passing through the edge 510 of the suction opening 51a in each variation. In this way, in all variations, the thickness of the collecting layer 52b can be increased to improve the dust removal rate of the filter 52, as described above.

Figure 7:
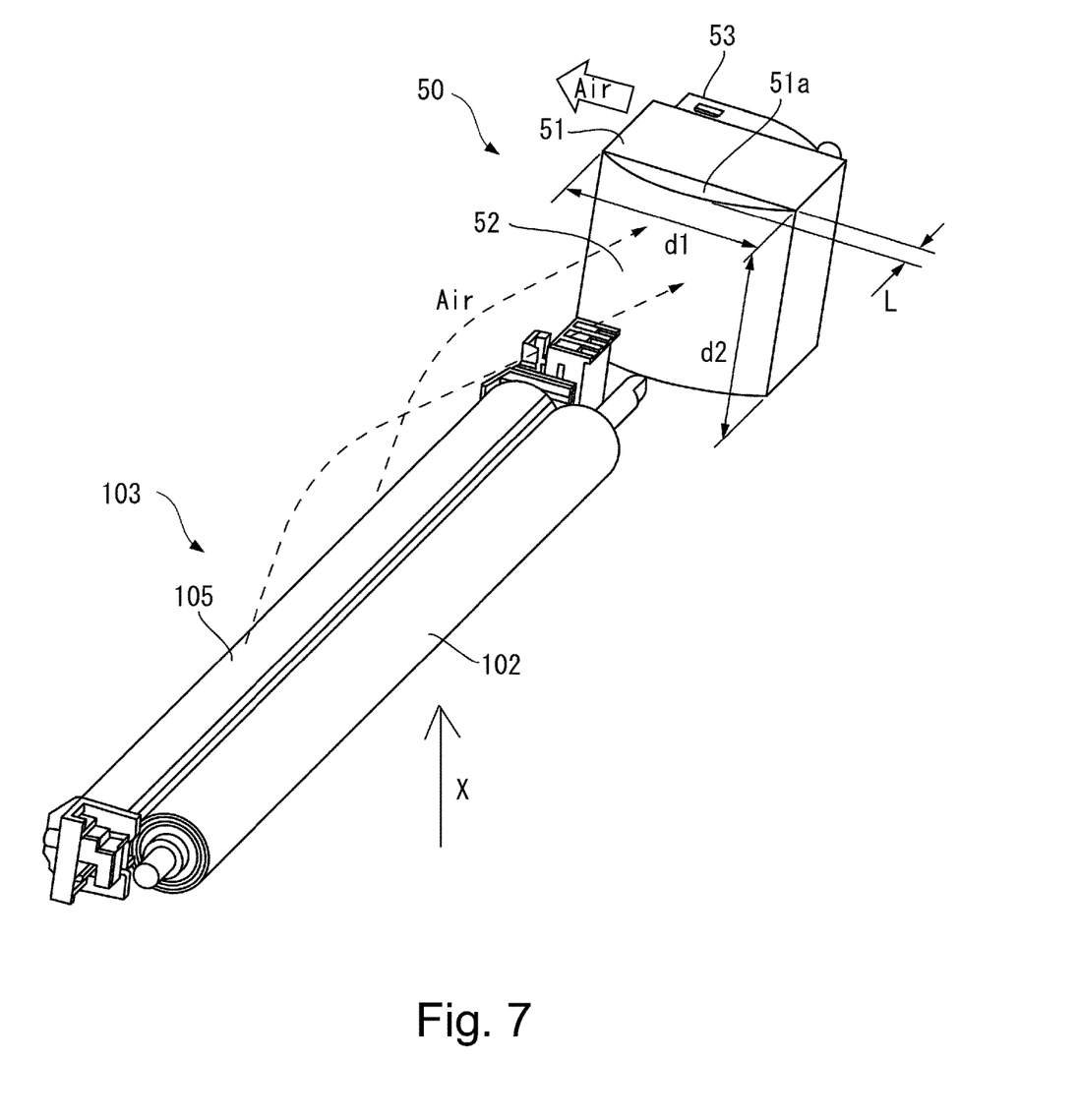
FIG. 7 is a perspective view showing the case where a filter unit is placed at the wide end of the fixing device.

The filter unit 50 is not limited to being disposed at the position as shown in part (a) of FIG. 3 above, but may be disposed at the edge of the fixing device 103 in the widthwise direction, for example. For example, this is suitable when it is difficult in terms of space to place it in a position as shown in part (a) of FIG. 3 above. FIG. 7 shows a case where the filter unit 50 is disposed at the widthwise end of the fixing device 103.

As shown in FIG. 7, the filter unit 50 is placed at the edge of the fixing device 103 in the widthwise direction with the filters 52 facing the fixing device 103. The filters 52 are formed in the form of a sheet by laminating the collecting layer 52b and the reinforcing layer 52a as described above (see part (a) of FIG. 4), and are arranged in the suction opening 51a in a curved shape with the collecting layer 52b inside. The dust generated by the vaporization of wax by the heat for fixing the toner image in the fixing device 103 is carried to the filters 52 along with the air flowing in the widthwise direction (rotation axis direction) of the fixing belt 105 generated by the operation of the fan 53, and is removed by the filters 52.

In this case, too, the filters 52 are arranged in the suction opening 51a in such a way that Formula 2 described above is satisfied. Here, if the suction opening 51a is formed as a square, the width "d1" in the short dimension and the width "d2" in the longitudinal direction of the suction opening 51a are equal. In that case, "0.003<L/d1<5" should be satisfied. By doing so, the dust removal rate of the filters 52 can be improved as described above. When the width in the longitudinal direction of the suction opening 51a is "d2 (>d1)", at least one of "0.003<L/d1<5" and "0.003<L/d2<5" should be satisfied. In addition, the filters 52 are arranged on the suction opening 51a so that they are curved over the upstream and downstream sides of the feeding direction (arrow X direction) of the recording material P, which is rotated 90 degrees from the state shown in FIG. 7 with respect to the suction opening 51a.

Second Embodiment

Figure 8:
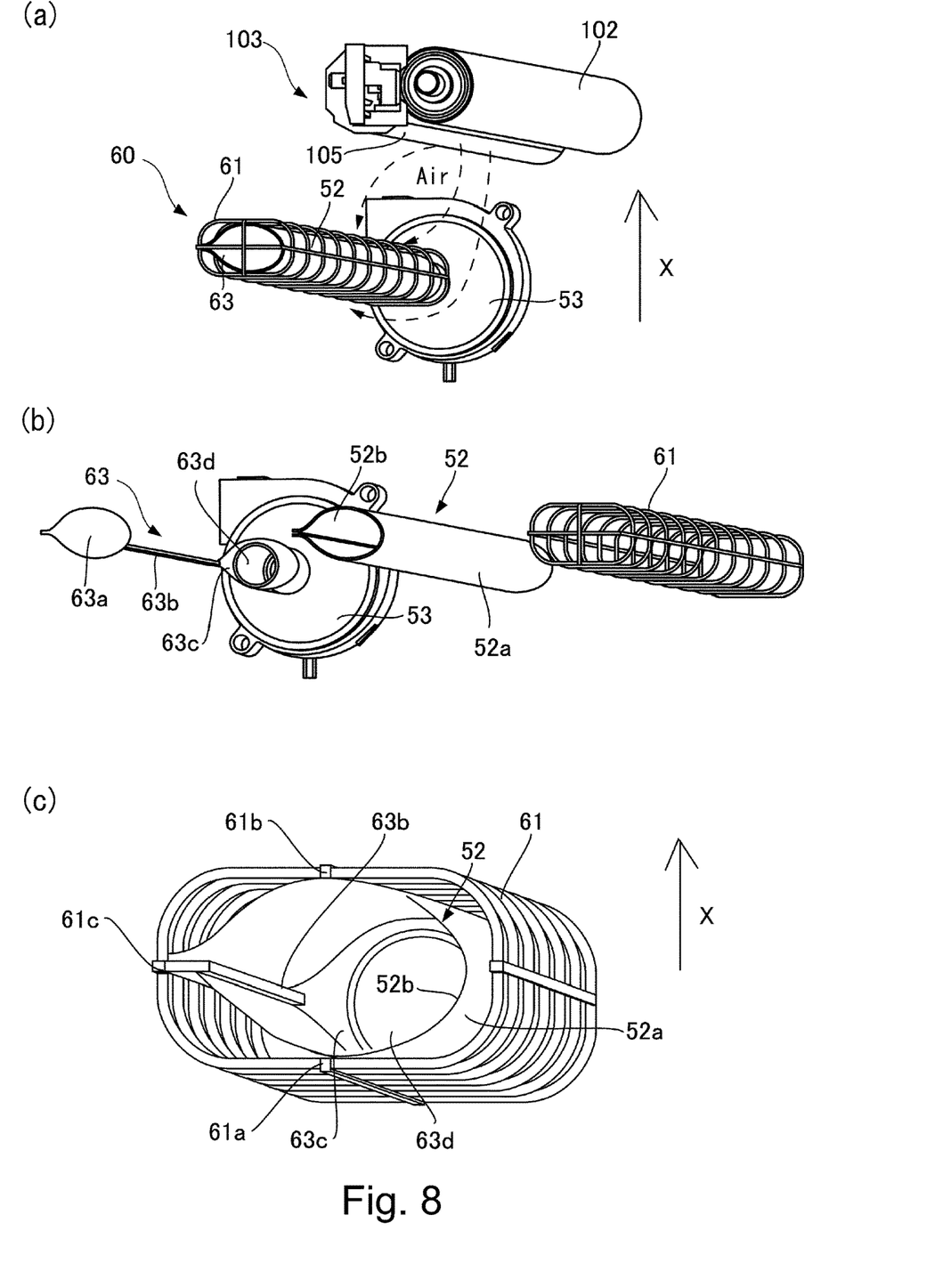
FIG. 8 is a drawing showing a filter unit of the second embodiment, part (a) of FIG. 8 showing a perspective view, part (b) of FIG. 8 showing an exploded view, and part (c) of FIG. 8 showing a partially enlarged view.
Figure 9:
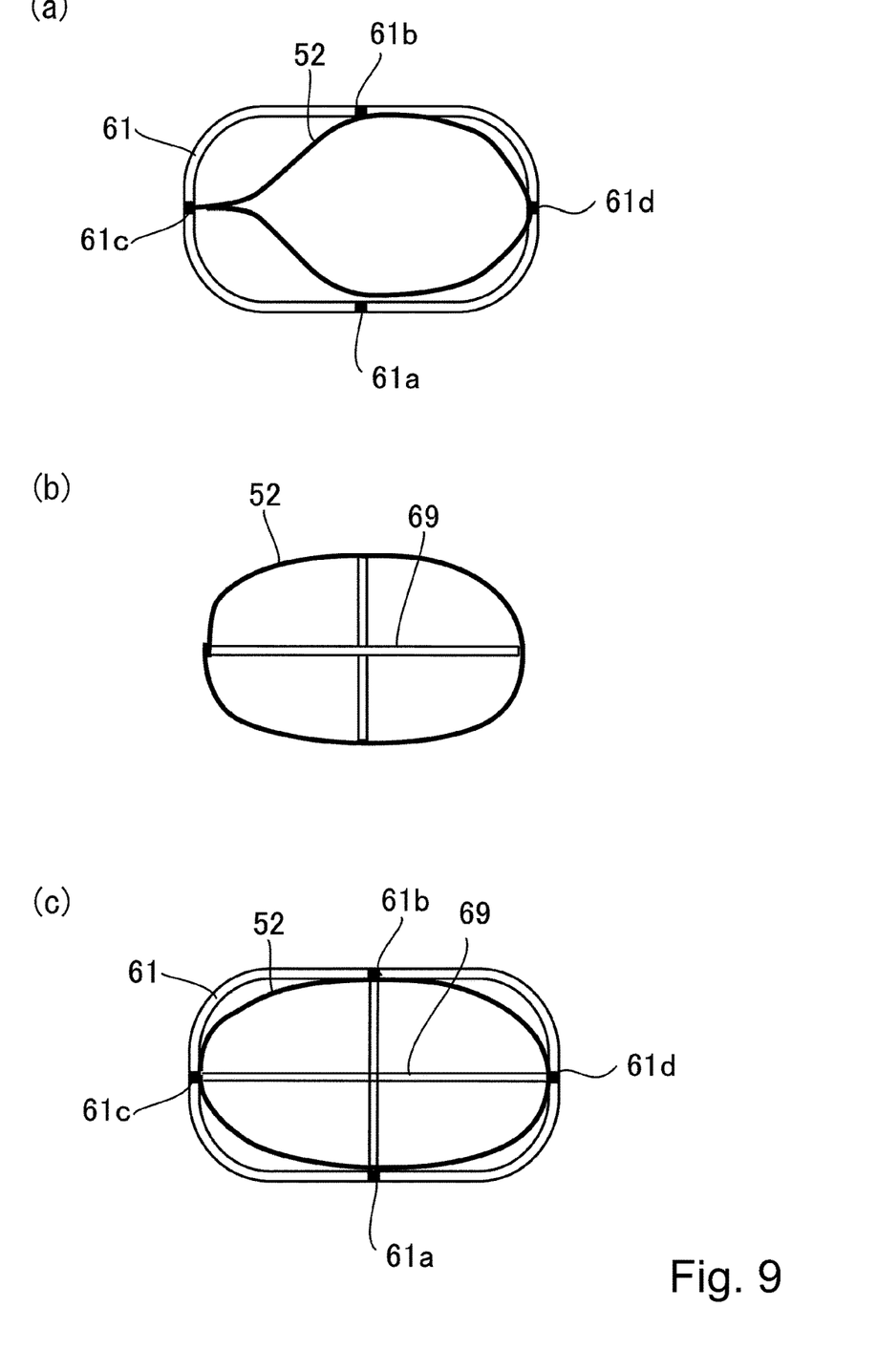
FIG. 9 is a cross-sectional view showing other configurations for filter holding, part (a) of FIG. 9 showing a configuration with cage only, part (b) of FIG. 9 showing a configuration with inner frame only, and part (c) of FIG. 9 showing a configuration with cage and inner frame.
Figure 10:
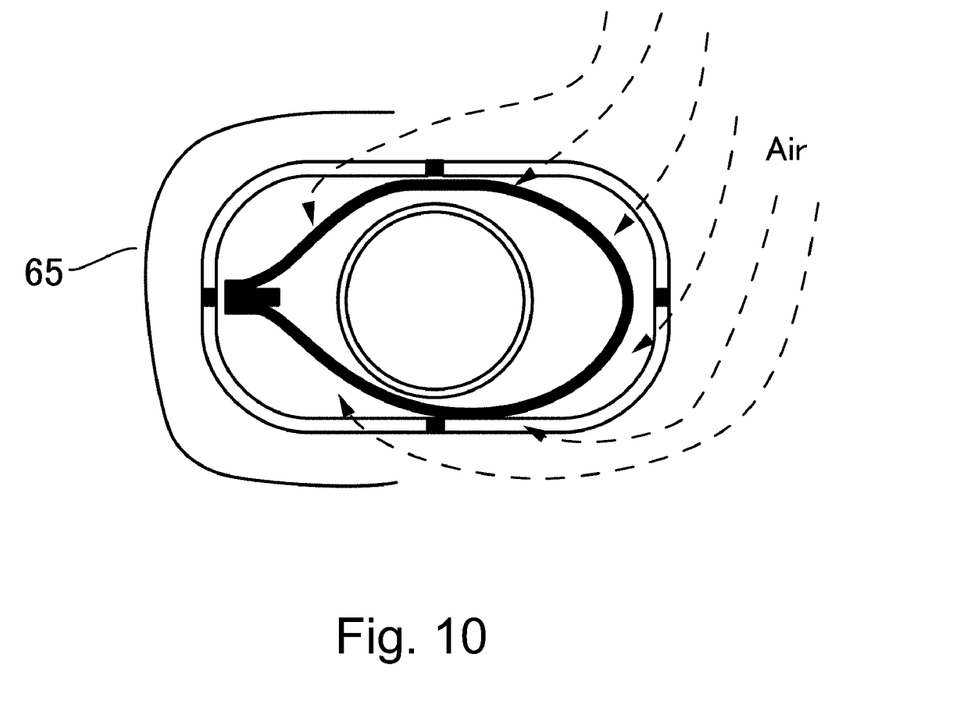
FIG. 10 is a conceptual drawing of the cover member.

Next, a filter unit 60 of the second embodiment is explained using part (a) of FIG. 8 through FIG. 10 with reference to FIG. 1. In the filter unit 60 of the second embodiment, the same configuration as that of the filter unit 50 of the first embodiment described above is indicated with the same marks, and the explanation is simplified or omitted.

The filter unit 60 of the second embodiment is located in the same position as the filter unit 50 of the first embodiment described above in the main assembly of the apparatus 100A. The filter unit 60, as a removal unit, is installed near the fixing device 103 and removes particulate dust generated by the vaporization of the parting agent by heat in the fixing device 103. In detail, the filter unit 60 is installed between a transfer portion 800 and the fixing device 103 in the feeding direction of the recording material P, with the filter 52 located on the fixing belt 105 side from the fixing nip portion 101b (see FIG. 1).

As shown in parts (a) and (b) of FIG. 8, the filter unit 60 is roughly divided into a cage 61, sheet-like filters 52, a holding frame 63, and a fan 53. In the case of the present embodiment, the filters 52 are held in a cylindrical shape by the holding frame 63 along the direction of the rotation axis of the fixing belt 105, with a collecting layer 52b inside and a reinforcing layer 52a outside (see part (a) of FIG. 4). The fan 53 is connected to the opening end side of one of the widthwise directions of the filters 52, which are held in a cylindrical shape by the holding frame 63, and generates an airflow that passes through the filters 52 from the outside and through the filters 52 (inside the filters) toward the opening end side. In other words, in the present embodiment, the cylindrical filters 52 serve as a duct through which air is sucked by the fan 53. The surface density of the collecting layer 52b is "50 (g/m$^2$) or more but less than 300 (g/m$^2$)" when the filters 52 are made cylindrical.

As shown in part (b) of FIG. 8, the holding frame 63 as a holding unit has a beam portion 63b that is extended from the fan 53 along the rotation axis direction (widthwise direction) of the fixing belt 105, and end holding portions 63a and 63c that are provided at both ends of the beam portion 63b. The beam portion 63b holds the filters 52 in a cylindrical shape by fixing one end of the sheet-like filters 52 and the other end by heat fusion as shown in part (c) of FIG. 8. In view of the dust removal rate by the filters 52, the beam 63b is preferably provided on the far side from the fixing nip portion 101b in the direction intersecting the rotation axis direction (widthwise direction) of the fixing belt 105 and the feeding direction of the recording material P. This is because at the beam portion 63b, the filters 52 are heat-fused, and the heat-fusing causes the fibers to melt and harden, which reduces the air permeability and makes it difficult to collect the dust contained in the air.

The end holding portions 63a and 63c are used to fix the ends of the sheet-like filters 52 to the beam portion 63b without gaps by heat fusion. These end holding portions 63a and 63c determine the cross-sectional shape (in this case, an approximate water drop shape) of the cylindrical filters 52 and maintain the shape of the filters 52. As shown in part (b) of FIG. 8, the end holding portion 63b on the side close to the fan 53 has an exhaust opening 63d connected to the fan 53 to allow air to pass through. On the other hand, the end holding portion 63a as the shielding portion on the far side from the fan 53 shields the end portion of the filters 52 so that air does not enter the filters 52 from the end portion. This is because if the edge of the filters 52 is not shielded, air can easily enter the filters 52 from the edge without passing through the filters 52, and the dust removal rate by the filters 52 is reduced. By shielding the edge of the filters 52, the air does not enter the filters 52 from the edge, but passes through the reinforcing layer 52a and the collecting layer 52b of the filters 52 before passing through the filters 52.

As shown in part (c) of FIG. 8, the outer circumference of the filters 52 held in a cylindrical shape by the holding frame 63 is covered by a permeable cage 61. The cage 61 has a frame fixing portion 61c that fixes the holding frame 63. The cage 61 fixes the outer circumference of the filters 52 to maintain the filters 52 in a cylindrical shape and also protects the filters 52 so that the shape of the filters 52 does not change due to external impacts. For this purpose, the cage 61 has an upstream fixing portion 61a that is fixed upstream in the feeding direction (arrow X direction) of the recording material P, and a downstream fixing portion 61b that is fixed downstream. The cage 61 can be a member that is permeable and has a certain rigidity, and may be formed in a cylindrical shape by wire mesh or perforated metal.

In the above configuration, when the fan 53 operates, the air containing dust generated by the fixing device 103 is suctioned from the entire circumference of the filters 52, and the dust is removed by the filters 52 (in detail, the collecting layer 52b). In the present embodiment, the filter area can be increased because the cylindrical filters 52 also serve as ducts, in other words, it is the same as placing filters 52 over the entire circumference of the duct. In addition, since the filters 52 are made cylindrical by curving the collecting layer 52b inward, the thickness of the collecting layer 52b can be increased. Therefore, the dust removal rate of the filters 52 can be improved.

Third Embodiment

As shown in part (a) of FIG. 9, without using the holding frame 63 (see part (c) of FIG. 8), the filters 52 are heat-fused to the fixed portions (61a, 61b, 61c, 61d) of the cage 61 so that the cross-sectional shape is a cylinder such as an ellipse or a circle, and the filters 52 are held in place. That is, the cage 61 is provided to enclose the pre-tubularized filters 52 and holds the filters 52 in a cylindrical shape by fixing the outer circumference of the filters 52.

As shown in part (b) of FIG. 9, an inner frame 69 may be used to hold the filters 52 in a cylindrical state from the inside, without using a holding frame 63 or cage 61. That is, the inner frame 69 is provided inside the pre-tubularized filters 52, and fixes the filters 52 from the inside to hold them in a tubular state. In the example shown in part (b) of FIG. 9, a cross-shaped inner frame 69 is placed inside the elliptically cross-sectioned cylindrical filters 52.

Furthermore, as shown in part (c) of FIG. 9, the cage 61 (first holding unit) and the inner frame 69 (second holding unit) described above can be combined to hold the cylindrical filters 52. In this case, the inner frame 69 is formed so that the filters 52 are held between the cage 61 and the inner frame 69 from the inside at the fixed portions (61a, 61b, 61c, 61d) of the cage 61 where the filters 52 are heat-fused In the case of the configuration shown in parts (a) through (c) of FIG. 9 above, it is preferable to shield the ends of the filters 52 so that air does not enter the filters 52 from the ends, to reduce the dust removal rate by the filters 52, although the drawing is omitted.

As shown in FIG. 10, a cover member 65 may be provided on the side far from the fixing nip portion 101b in the direction intersecting the feeding direction of the recording material P in the direction intersecting the direction of the rotation axis of the fixing belt 105 (widthwise direction). The cover member 65 makes it easier for the air sucked by the fan 53 to pass through the filters 52.

Fourth Embodiment

Next, an example in which the collecting layer 52b that collects dust in the first to third embodiments' filters 52 is a glass fiber filter will be explained. The glass fiber filter is a sheet of micro-glass fibers bonded/laminated by a binder such as acrylic, PET, or silicon resin. The glass fiber filter is not given electrostatic force like the polypropylene fiber nonwoven fabric shown in the first embodiment, and collects dust by the physical shielding effect of the micro glass fibers.

Since the glass fiber filter has sufficient rigidity on its own, the reinforcing layer 52a as the base layer in the present embodiment is not for maintaining the shape, but serves to protect the glass fiber filter from damage. The material of the reinforcing layer 52a is wire mesh or PET non-woven fabric.

Glass fiber filters can combine micro-glass fibers with different outer diameters, and their performance can be adjusted according to their composition ratio. The glass fiber filter is also heat resistant and can be used in atmospheres above 120° C. A polypropylene fiber nonwoven fabric with electrostatic force gradually loses its electrostatic force when exposed to high temperatures of 80° C. or higher, and its performance deteriorates, but a glass fiber filter that does not use electrostatic force does not deteriorate its performance even at high temperatures. Therefore, the glass fiber filter of the present embodiment should be used when the filters are exposed to high temperatures, such as when the filters are placed close to the fixing belt 105.

Since glass fiber filters are not thermoplastic, an adhesive is used to attach the filters to the suction opening 51a. There are no special restrictions on the adhesive, but if the filters are exposed to a high temperature atmosphere, silicone adhesive is recommended.

Fifth Embodiment

Next, an example in which the first to third embodiments' filters 52 are PTFE filters will be explained. PTFE is an abbreviation for polytetrafluoroethylene. In the PTFE filter, the collecting layer 52b, which collects the dust, is composed of a PTFE membrane filter. The PTFE membrane filter has submicron-sized micropores that allow air to pass through the micropores and block the dust with the membrane portion. The micropores are formed by stretching and processing the PTFE membrane to create microscopic defects on the membrane. Since the PTFE membrane filter is thin, around several tens of microns thick, it requires a reinforcing sheet as a reinforcing layer 52a to protect the PTFE membrane filter while maintaining its shape. Although porous film is sometimes used as the reinforcing sheet, nonwoven fabric with high air permeability is often used. Depending on the application, PET nonwoven fabric, acrylic nonwoven fabric, PPS (polyphenylene sulfide) nonwoven fabric, aramid nonwoven fabric, and PTFE nonwoven fabric are used. A PTFE filter is an adhesive laminate of a PTFE membrane filter and a reinforcement sheet. In other words, the base layer of the filter in the present embodiment is the reinforcing sheet. The PTFE membrane filter is prone to defects due to static electricity generated by human hands and processing machines. Therefore, in order to reduce the effect of the defects, the PTFE membrane filter and the reinforcing sheet are sometimes alternately layered.

Since PTFE filters do not use electrostatic force, they can be used in high temperature atmosphere as well as glass fiber filters. If a highly heat-resistant material such as aramid nonwoven fabric is used for the reinforcing sheet, the filter can be used at 200° C. or higher. Due to their structure, PTFE filters retain less dust (the amount of dust that can be retained without degrading performance) than glass fiber filters, but they have lower pressure drop than glass fiber filters. Therefore, if the required dust retention is low, a PTFE filter with low pressure drop can be used. The power of the fan that passes air through the filter can be reduced to reduce noise. In some cases, glass fiber filters and PTFE filters are laminated in order to reduce the pressure drop while maintaining the dust retention capacity.

The method of fixing the PTFE filter is described as follows. If thermoplastic resin is used for the reinforcement sheet, it can be thermally fused when the filters are attached to the suction opening 51a. If thermal fusion is difficult, silicon adhesive or other adhesive is used as in the case of glass fiber filters.

Each of the above-mentioned embodiments can also be applied to a configuration in which a roller-shaped fixing roller is used instead of the fixing belt 105. The above embodiments are also applicable to a configuration in which the fixing belt 105 is heated, as well as to a configuration in which the pressure roller 102 is heated. Furthermore, the pressure roller 102 can be a belt-like pressure belt.

In each of the above-mentioned embodiments, the image forming apparatus 100 of the intermediate transfer method, which transfers the toner image from the photosensitive drum 1Y to 1K to the intermediate transfer belt 8 and then transfers the toner image from the intermediate transfer belt 8 to the recording material P as an example, is explained, but this invention is not limited to this. The above-mentioned embodiments can be applied to an image forming apparatus of the direct transfer method, in which the toner image is directly transferred from the photosensitive drums 1Y to 1K (equivalent to image bearing members), which rotate bearing the toner image, to the recording material P.

According to the present invention, in a case of installing a filter with a collecting layer that collects dust and a reinforcing layer that reinforces the collecting layer in the suction opening of the duct, the filter can be easily configured to sufficiently remove dust.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2021-040972 filed on Mar. 15, 2021, and Na 2022-009818 filed on Jan. 26, 2022, which are hereby incorporated by reference herein in their entirety.

What is claimed is:
1. An image forming apparatus comprising:
an image forming unit configured to form a toner image on a recording material by using toner containing a parting agent;
a fixing unit provided with a first rotatable member and a second rotatable member contacting said first rotatable member, configured to form a fixing nip portion for fixing the toner image on the recording material by applying heat and pressure while feeding and nipping the recording material;

a heating portion configured to heat said first rotatable member; and a removal unit provided in a neighborhood of said fixing unit and configured to remove particulate dust generated due to vaporization of the parting agent by heat in said fixing unit, wherein said removal unit includes:

a sheet-like filter provided with a base layer and a collecting layer laminated on said base layer for collecting dust, a holding unit configured to hold said filter in a cylindrical shape, a longitudinal direction of said filter held in the cylindrical shape being along a rotational axis direction of said first rotatable member and the collecting layer being disposed inside of the base layer with respect to a radial direction of said filter held in the cylindrical shape, and a fan generating an air flow inside of said cylindrical shape which causes air passing from outside of said filter to inside of said filter to flow with respect to the radial direction of said filter.

2. An image forming apparatus according to claim 1, wherein said image forming unit includes an image bearing member configured to bear the toner image and rotate, and a transfer portion configured to transfer the toner imager from said image bearing member to the recording material, and wherein said filter held in the cylindrical shape by said holding unit is provided between said transfer portion and said fixing unit with respect to a feeding direction of the recording material.

3. An image forming apparatus according to claim 2, wherein said filter held in the cylindrical shape by said holding unit is disposed at a side of said first rotatable member relative to said fixing nip portion in a direction perpendicular to the feeding direction of the recording material.

4. An image forming apparatus according to claim 1, wherein said holding unit includes a beam portion, and wherein said beam portion holds an end of said filter and an opposing end of said filter so as to hold said filter in the cylindrical shape.

5. An image forming apparatus according to claim 4, wherein said filter held in the cylindrical shape is formed with openings at both ends thereof in the rotational axis direction of first rotatable member, and wherein said holding unit is provided with shielding portions disposed at openings of both ends and configured to maintain said filter in the cylindrical shape and to shield said openings to prevent air from intruding.

6. An image forming apparatus according to claim 4, wherein said removal unit is provided with a cage shielding portion disposed so as to surround outside of said filter in a circumferential direction of said filter held in the cylindrical shape and configured to maintain said filter in the cylindrical shape.

7. An image forming apparatus according to claim 1, wherein said holding unit is provided so as to enclose said filter formed beforehand in the cylindrical shape, and maintains said filter in the cylindrical shape by fixing an outer periphery of said filter.

8. An image forming apparatus according to claim 7, wherein said holding unit is a first holding unit, and wherein said removal unit includes a second holding unit provided inside of said filter held by said first holding unit in the cylindrical shape and configured to hold said filter by nipping said filter from inside between said second holding unit and said first holding unit.

9. An image forming apparatus according to claim 1, wherein said holding unit is provided inside of said filter formed beforehand in the cylindrical shape, and holds said filter in the cylindrical shape by fixing said filter from inside.

10. An image forming apparatus according to claim 1, wherein a surface density of said filter is 50 $(g/m^2)$ or more and 300 $(g/m^2)$ or less.

11. An image forming apparatus according to claim 10, wherein said collecting layer is formed of a nonwoven fabric of a polypropylene fiber and said base layer is formed of a nonwoven fabric of a polyethylene terephthalate fiber.

12. An image forming apparatus according to claim 1, wherein said collecting layer is adhered to said base layer, and wherein an area of said collecting layer and an adhering area of said collecting layer and said base layer satisfy the following formula:

$$1/120 < \text{the adhering area/the area of said collecting layer} < 1/3.$$

13. An image forming apparatus according to claim 1, wherein said collecting layer is composed of a glass fiber filter.

14. An image forming apparatus according to claim 1, wherein said filter is composed of a PTFE filler made by laminating said collecting layer as a PTFE membrane filter and said base layer as a reinforcing filter.

* * * * *